(12) United States Patent
Kwon et al.

(10) Patent No.: US 10,031,265 B2
(45) Date of Patent: Jul. 24, 2018

(54) DISPLAY DEVICE WITH A WINDOW INCLUDING A LIGHT-PATH CHANGING LAYER

(71) Applicant: SAMSUNG DISPLAY CO., LTD., Yongin-si, Gyeonggi-do (KR)

(72) Inventors: Jaejoong Kwon, Suwon-si (KR); Hyesog Lee, Osan-si (KR); Yunseon Do, Hwaseong-si (KR); Chio Cho, Gwangju (KR)

(73) Assignee: Samsung Display Co., Ltd., Yongin-si (KR)

( * ) Notice: Subject to any disclaimer, the term of this patent is extended or adjusted under 35 U.S.C. 154(b) by 162 days.

(21) Appl. No.: 15/130,717

(22) Filed: Apr. 15, 2016

(65) Prior Publication Data

US 2016/0377770 A1 Dec. 29, 2016

(30) Foreign Application Priority Data

Jun. 26, 2015 (KR) .................. 10-2015-0090907

(51) Int. Cl.
*G02B 5/02* (2006.01)
*G02B 5/00* (2006.01)
*H01L 51/52* (2006.01)

(52) U.S. Cl.
CPC ........... *G02B 5/0242* (2013.01); *G02B 5/003* (2013.01); *G02B 5/0236* (2013.01);
(Continued)

(58) Field of Classification Search
CPC .......... G02B 5/003; G02B 5/20; G02B 5/206; G02B 5/22; G02B 6/0011; G02B 6/0033; G02B 6/0035; G02B 6/0036; G02B 6/0038; G02B 6/004; G02B 6/0041; G02B 6/0043; G02F 2001/133331; G02F 2001/133388;
(Continued)

(56) References Cited

U.S. PATENT DOCUMENTS 8,093,804 B2  1/2012  Lee et al.
8,599,149 B2  12/2013  Lee et al.
(Continued)

FOREIGN PATENT DOCUMENTS

KR  10-2011-0056897 A  5/2011
KR  10-2012-0010402 A  2/2012
(Continued)

OTHER PUBLICATIONS

U.S. Office Action dated Jan. 9, 2017, issued in cross-reference U.S. Appl. No. 15/051,443 (9 pages).

*Primary Examiner* — Arnel C Lavarias
(74) *Attorney, Agent, or Firm* — Lewis Roca Rothgerber Christie LLP

(57) ABSTRACT

A display device includes: a display panel to display an image; a window covering the display panel, and including a display area through which the image is to be transmitted, and a non-display area surrounding the display area, the window including: a window base opposite the display panel; a printing layer below the window base; and a light-path changing layer between the window base and the printing layer, the light-path changing layer including: an optical structure; and a resin coating the optical structure; and an adhesive layer between the display panel and the window.

20 Claims, 11 Drawing Sheets

(52) U.S. Cl.
CPC ........ *G02B 5/0294* (2013.01); *H01L 51/5237*
(2013.01); *H01L 51/5262* (2013.01)

(58) Field of Classification Search
CPC ............. G02F 1/1335; G02F 1/133504; G02F
1/133512; G02F 1/133606; G02F
2001/133607
USPC .... 359/599, 601, 609, 614; 349/61, 62, 104,
349/110, 162; 313/502, 503, 504, 506,
313/509
See application file for complete search history.

(56) References Cited

U.S. PATENT DOCUMENTS

| | | | |
|---|---|---|---|
| 8,827,528 B2* | 9/2014 | Takeda | H01H 13/83 200/314 |
| 9,535,205 B2* | 1/2017 | Huang | G02B 6/005 |
| 2004/0189191 A1* | 9/2004 | Ohshita | H01L 51/5284 313/504 |
| 2005/0263775 A1 | 12/2005 | Ikeda et al. | |
| 2006/0290271 A1 | 12/2006 | Cok | |
| 2007/0201234 A1 | 8/2007 | Ottermann | |
| 2010/0244682 A1 | 9/2010 | Lee et al. | |
| 2013/0100258 A1 | 4/2013 | Kim et al. | |
| 2013/0215497 A1* | 8/2013 | Chan | G02B 5/0294 359/350 |
| 2013/0241402 A1 | 9/2013 | Wang | |
| 2014/0021499 A1 | 1/2014 | Jang | |
| 2014/0145979 A1 | 5/2014 | Lee | |
| 2014/0315463 A1 | 10/2014 | Khachatryan | |
| 2014/0339517 A1 | 11/2014 | Park et al. | |
| 2015/0226906 A1* | 8/2015 | Hsieh | G02F 1/167 359/296 |
| 2015/0253615 A1* | 9/2015 | Ryu | G02F 1/133512 349/58 |
| 2016/0377770 A1 | 12/2016 | Kwon et al. | |

FOREIGN PATENT DOCUMENTS

| | | |
|---|---|---|
| KR | 10-2013-0014325 A | 2/2013 |
| KR | 10-2013-0043966 A | 5/2013 |
| KR | 10-2014-0040974 A | 4/2014 |
| KR | 10-2014-0073317 A | 6/2014 |
| KR | 10-2014-0080256 A | 6/2014 |

* cited by examiner

DISPLAY DEVICE WITH A WINDOW INCLUDING A LIGHT-PATH CHANGING LAYER

CROSS-REFERENCE TO RELATED APPLICATION

This application claims priority to and all the benefits accruing under 35 U.S.C. § 119 of Korean Patent Application No. 10-2015-0090907, filed on Jun. 26, 2015, with the Korean Intellectual Property Office (KIPO), the disclosure of which is incorporated herein in its entirety by reference.

BACKGROUND

1. Field

One or more aspects of example embodiments of the present invention relate to a display device.

2. Description of the Related Art

Electronic devices that provide images to users, such as televisions ("TV"), digital cameras, laptop computers, navigation devices, and mobile phones, include a display device for displaying the images. A display device includes a display panel for generating an image to display the image, and a window on top of the display panel to protect the display panel.

The image generated on the display panel may be transmitted through the window to be viewed by a user. The window includes a display area on which an image is displayed, and a non-display area around (e.g., surrounding) the display area. The non-display area of the window may be designed in various colors by using a printing layer. However, light reaching the printing layer may be scattered by reflection (e.g., total reflection), thus causing light leakage.

The above information disclosed in this Background section is for enhancement of understanding of the background of the present invention, and therefore, it may contain information that does not constitute prior art.

SUMMARY

One or more aspects of example embodiments of the present invention are directed to a display device capable of reducing or preventing light leakage caused by reflection (e.g., total reflection).

According to an exemplary embodiment of the present invention, a display device includes: a display panel configured to display an image; a window covering the display panel and including a display area through which the image is to be transmitted, and a non-display area surrounding the display area, the window including: a window base opposite the display panel; a printing layer below the window base; and a light-path changing layer between the window base and the printing layer, the light-path changing layer including: an optical structure; and a resin coating the optical structure; and an adhesive layer between the display panel and the window.

The optical structure may have a refractive index that is less than that of the resin by 0.01 or more.

The optical structure may include at least one selected from $SiO_2$, polymethylmethacrylate ("PMMA"), tetrafluoroethylene ("TFE"), a fluorinated ethylene propylene copolymer ("FEP"), a hollow glass bead, and an aerogel.

The optical structure may include one of a bead shape, a lens shape, a prism shape, a trapezoid shape, and an elliptical shape.

The display device may further include a base film between the window base and the printing layer.

The light-path changing layer may be between the base film and the printing layer.

The light-path changing layer may include a base film.

The optical structure may correspond to a pattern layer on the base film.

The display device may further include a pattern layer corresponding to the optical structure on a surface of the base film, the pattern layer having a low refractive index, and the base film having a high refractive index.

The display device may further include: a pattern layer on another surface of the base film, the pattern layer having a low refractive index; and an optically clear adhesive ("OCA") layer on the pattern layer, the OCA layer having a high refractive index.

The pattern layer may have one of a lens shape and a prism shape.

The display device may further include an optically clear adhesive ("OCA") layer between the window base and the printing layer.

The light-path changing layer may include the OCA layer.

The optical structure may be located in the OCA layer.

The display device may further include a light-absorbing member at a side of the window.

The printing layer may be at the non-display area and may contact the adhesive layer.

The printing layer may include a first decor printing layer, a second decor printing layer, and a light-shielding printing layer.

The first decor printing layer may include a pearlescent pigment and may have a transparent color.

The second decor printing layer may be a white printing layer.

The light-shielding printing layer may be a black printing layer and may contact the adhesive layer.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Figure 1:
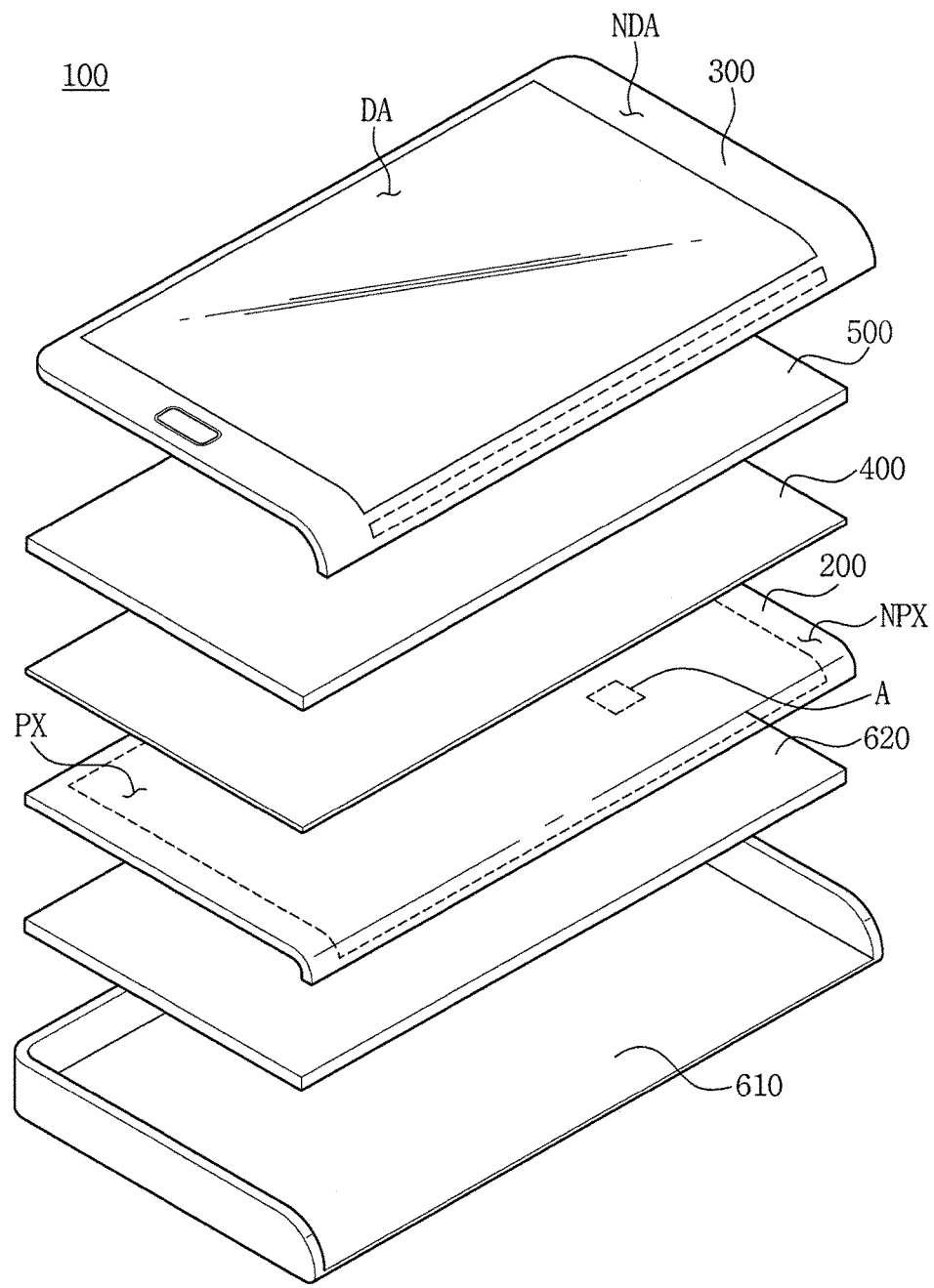
FIG. 1 is an exploded perspective view illustrating a display device according to an exemplary embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "or" refers to "and/or," and the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Hereinafter, exemplary embodiments of a display device according to one or more embodiments of the present invention are described as an organic light emitting diode ("OLED") display device, for convenience. However, the display device is not limited thereto, and aspects and features of the present invention may be applied to a liquid crystal display ("LCD") device, a plasma display panel ("PDP") device, a field emission display ("FED") device, and/or the like.

In addition, in the accompanying drawings, the display device according to one or more exemplary embodiments of the present invention is illustrated as an active matrix organic light emitting diode ("AMOLED") display device having a 2Tr-1 Cap (e.g., two transistors-one capacitor) structure in which a single pixel includes two thin film transistors ("TFT") and a single capacitor. However, the present invention is not limited thereto. Thus, in the OLED display device according to one or more exemplary embodiments, the number of TFTs, the number of capacitors, and the number of wirings are not limited. As used herein, the term "pixel" refers to a minimum unit for displaying an image, and the OLED display device displays an image through a plurality of pixels.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art, and should not be interpreted in an ideal or excessively formal sense, unless clearly defined in the present specification.

Hereinafter, a display device 100 according to an exemplary embodiment of the present invention will be described with reference to FIGS. 1, 2, and 3.

FIG. 1 is an exploded perspective view illustrating the display device 100 according to an exemplary embodiment of the present invention.

Referring to FIG. 1, the display device 100 includes a display panel 200 including a pixel area PX and a non-pixel area NPX, a housing 610 configured to accommodate (e.g., receive or house) the display panel 200, an impact-absorbing sheet 620 between the display panel 200 and the housing 610, a window 300 including a display area DA and a non-display area NDA, and an adhesive layer 500 between the display panel 200 and the window 300. The window 300 is on top of (e.g., above or covering) the display panel 200.

The non-pixel area NPX may surround the pixel area PX, and the non-display area NDA may surround the display area DA. The pixel area PX of the display panel 200 corresponds to the display area DA of the window 300, and the non-pixel area NPX of the display panel 200 corresponds to the non-display area NDA of the window 300. For ease of illustration, the housing 610, the display panel 200, the window 300, and the adhesive layer 500 are illustrated as being separated from one another in FIG. 1.

The pixel area PX of the display panel 200 may be an area at which an image is generated to be displayed. The non-pixel area NPX of the display panel 200 may be an area at which an image is not generated. The image generated on the display panel 200 is transmitted through the window 300 to be viewed by a user.

The display panel 200 is not limited to a particular type (or kind) of display panel. For example, the display panel 200 may include a self-emission-type display panel, such as an OLED display panel, or a non-self-emission-type display panel, such as an LCD panel and/or an electrophoretic display ("EPD") panel. A detailed description of the display panel 200 will be provided later below with reference to FIG. 10.

The housing 610 is configured to accommodate (e.g., receive or house) the display panel 200. FIG. 1 illustrates the housing 610 as a single unitary member that provides a space for accommodating (e.g., receiving or housing) the display panel 200 by way of example. However, in another exemplary embodiment, the housing 610 may have a structure in which two or more members are coupled to each other to form the housing 610.

The housing 610 may further accommodate (e.g., receive or house) a circuit board on which a driving element is mounted, in addition to the display panel 200, and as necessary, may further accommodate a power supply, such as a battery.

The impact-absorbing sheet 620 is located between the display panel 200 and the housing 610, and is configured to absorb an impact that may be applied to the display panel 200. Accordingly, the impact-absorbing sheet 620 may prevent or substantially prevent an external impact from being applied directly to the display panel 200. However, the present invention is not limited thereto, and in some embodiments, the impact-absorbing sheet 620 may be omitted.

The window 300 is arranged at a side of the display panel 200 on which an image is displayed. The window 300 is coupled to the housing 610 to form an exterior of the display device 100, along with the housing 610.

A polarizer 400 may be on the display panel 200. For example, the polarizer 400 may be between the display panel 200 and the adhesive layer 500. The polarizer 400 may convert an optical axis of light irradiated from the display panel 200.

The polarizer 400 may be arranged on the display panel 200 so as to cover at least a portion of the display panel 200. In another exemplary embodiment, the polarizer 400 may be formed to have the same or substantially the same size as that of the display panel 200, so as to cover an entire surface or substantially the entire surface of the display panel 200. The polarizer 400 may have a monolayer structure, or a multilayer structure including a polarizing film and a phase difference film.

In addition, in some embodiments, the display device 100 may further include a touch screen panel. The touch screen panel may be arranged on the display panel 200. For example, the touch screen panel may be arranged between the display panel 200 and the polarizer 400, or may be on the polarizer 400. Based on an input signal provided from the touch screen panel, the display panel 200 may provide an image to a user that corresponds to the input signal.

Hereinafter, the window 300 will be described in greater detail with reference to FIGS. 2 and 3.

Figure 2:
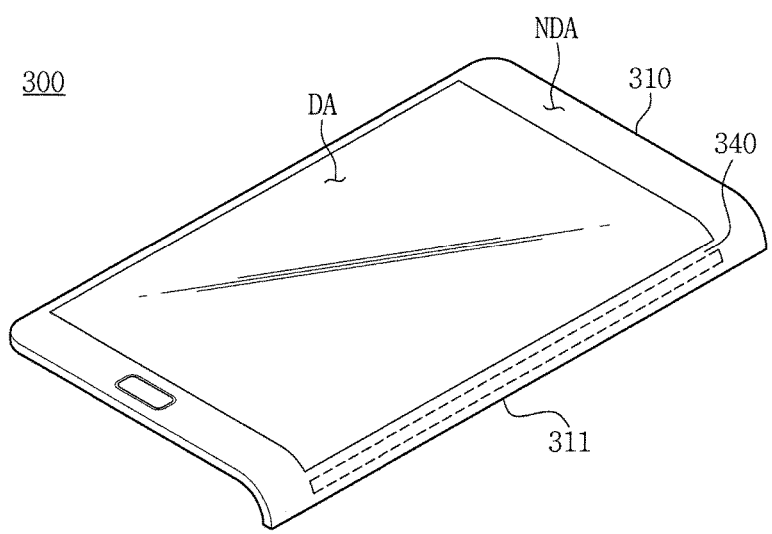
FIG. 2 is a perspective view illustrating a window of FIG. 1.

FIG. 2 is a perspective view illustrating the window 300 of FIG. 1. FIG. 3 is a cross-sectional view illustrating the display device according to an exemplary embodiment of the present invention. In FIG. 3, the housing 610 and the impact-absorbing sheet 620 are omitted.

The window 300 is arranged above (e.g., on top of) the display panel 200 to protect the display panel 200 from external scratches.

An upper surface of the window 300 includes the display area DA, and the non-display area NDA surrounding the display area DA. The display area DA may include an area on which an image to be provided to an observer is displayed. The non-display area DA may include an area at which an image is not displayed. The non-display area NDA may be printed in black. However, the color of the non-display area NDA is not limited thereto, and the non-display area NDA may be printed in various suitable colors other than black. For example, the non-display area NDA may be printed in white.

The window 300 may include a window base 310, a base film 330, an optically clear adhesive ("OCA") layer 320 between the window base 310 and the base film 330, a printing layer 340, and a light-path changing layer 350 between the base film 330 and the printing layer 340.

The window base 310 is arranged opposite to the display panel 200. A planar area of the window base 310 includes a display area DA and a non-display area NDA surrounding the display area DA, in a manner corresponding to a planar area of the window 300 including the display area DA and the non-display area NDA.

The window base 310 may be formed of a light-transmissive transparent film. Accordingly, an image generated at the pixel area PX of the display panel 200 may be transmitted through the window base 310 at the display area DA to be provided to a user.

In addition, the window base 310 may include (or be formed of) plastic or glass that has impact resistance. The window base 310 may have a quadrangular planar shape with rounded corners. In an exemplary embodiment, the window base 310 illustrated in FIG. 2 has a shape in which an edge (e.g., a right edge) 311 is curved. However, the shape of the window base 310 is not limited thereto. For example, in some exemplary embodiments, the window base 310 may have various suitable shapes, such as a circular shape including curved corners, and/or one or more curved edges (e.g., a curved left edge).

Although not illustrated, a hard coating layer and/or a protection layer may be arranged on the window base 310. In this case, the hard coating layer may use any suitable coating composition capable of enhancing the surface hardness of the window base 310. For example, an ultraviolet ("UV")-curable coating composition that does not require a high temperature treatment may be used.

The hard coating layer may include (or be formed of) an acrylate-based monomer or an inorganic compound. The hard coating layer may enhance the surface hardness and/or chemical resistance of the window base 310.

The protection layer may be arranged on the hard coating layer. The protection layer may include a functional coating layer, such as, for example, an anti-finger ("AF") coating layer, an anti-reflection ("AR") coating layer, and/or an anti-glare ("AG") coating layer.

The printing layer 340 is on a portion of a lower surface of the window base 310 adjacent to the display panel 200, in the non-display area NDA. In other words, the non-display area NDA corresponds to an area at which the printing layer 340 is located, and the display area DA corresponds to an area at which the printing layer 340 is absent (e.g., not located).

Figure 3:
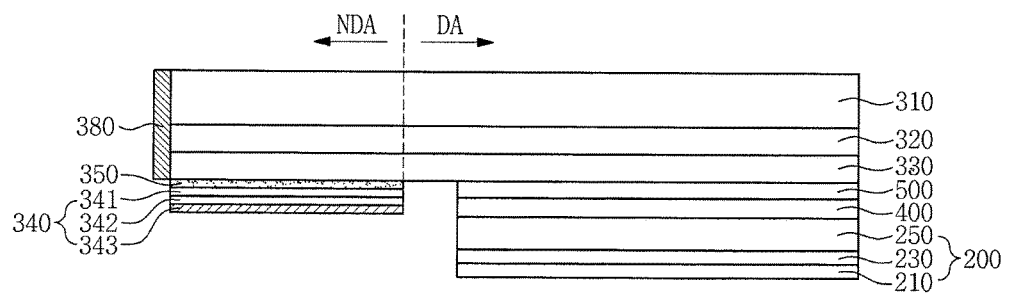
FIG. 3 is a cross-sectional view illustrating a display device according to an exemplary embodiment of the present invention.

Referring to FIG. 3, the base film 330 may be below the window base 310. The OCA layer 320 may be between (e.g., interposed between) the window base 310 and the base film 330.

The base film 330 may include a transparent film, such as polyethylene terephthalate ("PET"). However, the base film 330 may include any suitable light-transmissive transparent film, without being limited to the type (e.g., kind) thereof.

The base film 330 may include the printing layer 340 on a surface thereof, and the light-path changing layer 350 may be located between the base film 330 and the printing layer 340.

Hereinafter, the light-path changing layer 350 will be described in greater detail with reference to FIG. 4.

Figure 4:
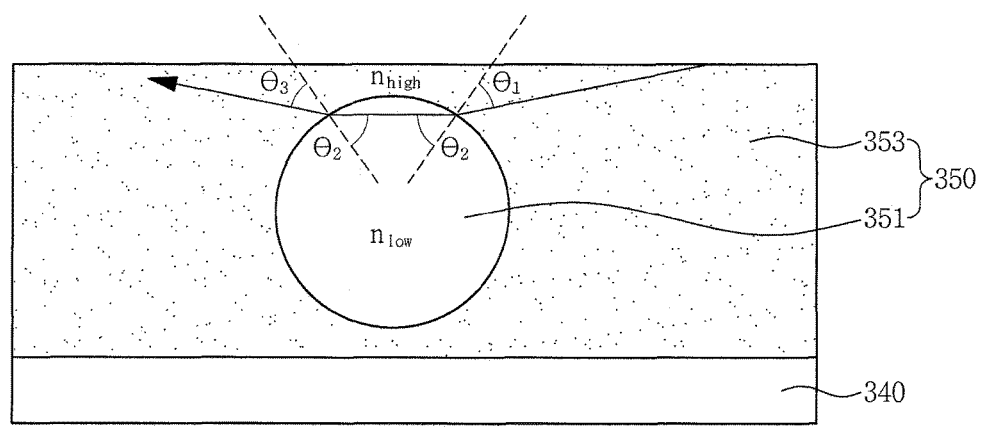
FIG. 4 is a mimetic view illustrating a light-path changing layer including an optical structure according to an exemplary embodiment of the present invention.

FIG. 4 is a cross-sectional view illustrating the printing layer 340 and the light-path changing layer 350 of the display device according to an exemplary embodiment of the present invention.

The light-path changing layer 350 is arranged between the window base 310 and the printing layer 340 to change a path of light. In more detail, the light-path changing layer 350 changes a path of reflected (e.g., totally reflected) light, which may cause light leakage, to thereby prevent or substantially prevent the reflected (e.g., totally reflected) light from reaching the printing layer 340.

The light-path changing layer 350 changes a path of light based on Fresnel reflection. As used herein, the term "Fresnel reflection" refers to reflection occurring when light passes through an interface between materials having different refractive-indices. Accordingly, the light-path changing layer 350 may have various suitable configurations that may adjust a path of light based on Fresnel reflection.

The light-path changing layer 350 may include an optical structure 351 having a low refractive index mixed with a resin 353 having a high refractive index, so as to be printed on the base film 330. However, the light-path changing layer 350 is not limited thereto. For example, in another exemplary embodiment, the light-path changing layer 350 may include a pattern of an optical structure formed on a surface of the base film 330, and a resin having a low refractive index formed (e.g., printed or coated) thereon, and/or may be formed in a manner in which an optical structure is inserted into the base film 330 and/or the OCA layer 320.

Although the optical structure 351 is illustrated as having a bead shape in FIG. 4, the shape of the optical structure 351 is not limited thereto, and in some embodiments, the optical structure 351 may have a lens shape, a prism shape, a trapezoid shape, and/or an elliptical shape. The optical structure 351 may include (or be formed of) at least one selected from $SiO_2$, poly(methyl methacrylate) ("PMMA"), tetrafluoroethylene ("TFE"), fluorinated ethylene propylene copolymer ("FEP"), a hollow glass bead, and aerogel.

Referring to FIG. 4, the light-path changing layer 350 may include the optical structure 351 having a low refractive index $n_{low}$, and the resin 353 having a high refractive index $n_{high}$. The optical structure 351 may have a refractive index in a range of about 1.3 to about 1.6, and the resin 353 that coats the optical structure 351 may have a refractive index in a range of about 1.6 to about 3.0. More particularly, the optical structure 351 may have a refractive index less than that of the resin 353 by about 0.01 or more.

As described in the foregoing, a path of light is changed between the optical structure 351 and the resin 353 having different refractive indices based on Fresnel reflection. In other words, the light-path changing layer 350 changes a path of light to prevent or substantially prevent reflected (e.g., totally reflected) light, which may cause light leakage, from reaching the printing layer 340.

According to some exemplary embodiments, a light-absorbing member 380 may be further included as illustrated in FIG. 3.

The light-absorbing member 380 may be arranged at a side surface of the window 300, and may absorb the light having the path changed by the light-path changing layer 350 to extinguish the light. In this case, light that is not absorbed by the light-absorbing member 380 may again undergo reflection (e.g., total reflection) to be absorbed by the polarizer 400. Accordingly, the light-absorbing member 380 may reduce (e.g., significantly reduce) light leakage.

As illustrated in FIG. 3, the light-absorbing member 380 may be arranged at side surfaces of the window base 310, the OCA layer 320, and the base film 330, respectively. However, the location of the light-absorbing member 380 is not limited thereto. For example, in another exemplary embodiment, the light-absorbing member 380 may extend onto side surfaces of the light-path changing layer 350 and/or the printing layer 340, respectively, or may be omitted.

The light-absorbing member 380 may include a base resin, a light-absorbing material, a UV-curing accelerator, and/or the like.

The base resin is a material that may be combined with the light-absorbing material and/or the UV-curing accelerator to form a base for the light-absorbing member 380. While the base resin may be formed of an acrylate-based polymer, the material used for forming the base resin is not limited thereto. The base resin formed of an acrylate-based polymer may be formed by irradiating UV light on a composition including an acrylate monomer, an acrylate oligomer, and/or a photo-initiator, to thereby perform a reaction among the composition.

The light-absorbing material is a material for preventing or reducing light leakage. In other words, the light-absorbing material may be a material for performing a primary function of the light-absorbing member 380. The light-absorbing material includes colored particles. The colored particles may include black particles, such as carbon black. However, the color of the colored particles is not limited thereto, and in some embodiments, the colored particles may include particles having various suitable colors that may provide a light-absorbing effect. Since carbon black used as the colored particles absorbs light in a visible light range, an excellent light leakage prevention or reduction effect may be achieved through the use of carbon black as the light-absorbing material.

The UV-curing accelerator includes a material for allowing the UV-curing of the base resin to be performed relatively easily. As the light-absorbing member 380 may include the UV-curing accelerator, the curing process of the base resin may be performed relatively easily, even though the light-absorbing member 380 may include the black particles.

A description of the changed path of the reflected (e.g., totally reflected) light and the light leakage reduction effect due to the light-path changing layer 350 and the light-absorbing member 380 included in the display device according to one or more exemplary embodiments will be further provided below with reference to FIGS. 5 to 8.

The printing layer 340 may be on a portion of a surface of the base film 330 at the non-display area NDA. The printing layer 340 may prevent or substantially prevent the outward visibility of a driver for driving the display panel 200 and/or an accommodating portion in which the display panel 200 is accommodated (e.g., received).

The printing layer 340 may include (or be formed of) an organic material having a color (e.g., a predetermined color). Accordingly, the color of the printing layer 340 at the non-display area NDA of the window base 310 may be displayed to a user.

The printing layer 340 may include various suitable colors, for example, black or white. In the case that the printing layer 340 is black, the printing layer 340 may include a black matrix. In the case that the printing layer 340 is white, the printing layer 340 may include an organic insulating material, such as a white resin. In another exemplary embodiment, the printing layer 340 may include (or be formed of) an opaque inorganic insulating material, such as CrOx or MoOx, or an opaque organic insulating material, such as a black resin. Accordingly, the printing layer 340 may block light in the display panel 200, prevent or substantially prevent the visibility of an internal structure of the display panel 200, and determine the color of the window 300.

The printing layer 340 may be formed on the base film 330 by printing a printing composition on the base film 330, and the base film 330 may be bonded to the window base 310. However, the manner of forming the printing layer 340 on the base film 330, and the manner of which the base film 330 is bonded to a surface of the window base 310 are not limited thereto, and may include various suitable manners known in the pertinent art.

The printing layer 340 may have a monolayer structure. However, the structure of the printing layer 340 is not limited thereto, and the printing layer 340 may have a multilayer structure including a plurality of layers having the same or substantially the same thickness, or different thicknesses.

Referring to FIG. 3, the printing layer 340 includes a plurality of printing layers 341, 342, and 343. The printing layers 341, 342, and 343 include a first decor printing layer 341, a second decor printing layer 342, and a light-shielding printing layer 343 arranged on a portion of a surface of the base film 330 at the non-display area NDA.

The first decor printing layer 341 may have a transparent color, and may include a pearlescent pigment having a glittering characteristic. In other words, the first decor printing layer 341 may provide a glittering effect that is visible to a user. In another exemplary embodiment, the first decor printing layer 341 may include a pigment representing various textures.

The second decor printing layer 342 may be a white printing layer. However, the color of the second decor printing layer 342 is not limited thereto, and the second decor printing layer 342 may have a different color other than white, or may have one or more of various different colors. While the second decor printing layer 342 is illustrated as a single layer in an exemplary embodiment, the second decor printing layer 342 may include a plurality of layers having the same color, or different colors, so as to provide a relatively distinct color.

The light-shielding printing layer 343 may be a black printing layer. The black light-shielding printing layer 343 may have a light shielding ratio higher than those of the first decor printing layer 341 and the second decor printing layer 342.

While the three printing layers including the first decor printing layer 341, the second decor printing layer 342, and the light-shielding printing layer 343 are illustrated in FIG. 3 by way of example, the number of printing layers is not limited thereto. In another exemplary embodiment, more than three printing layers may be arranged on a portion of a surface of the base film 330 at the non-display area NDA.

In some embodiments, the printing layer 340 may contact the adhesive layer 500 between the display panel 200 and the window 300. For example, the printing layer 340 may contact the adhesive layer 500 in case that the window base 310 may have a circular shape including curved corners.

The adhesive layer 500 is located between the polarizer 400 and the window 300, and may couple the display panel 200 to the window 300.

To prevent or substantially prevent the adhesive layer 500 from reducing the luminance of light emitted from the display panel 200, the adhesive layer 500 may have a transparent characteristic. The adhesive layer 500 may include (or be formed of) a transparent polymer resin that has an adhesive property and may be photocurable or thermocurable. For example, the adhesive layer 500 may include (or be formed of) a photocurable resin that may be cured by light irradiation.

Hereinafter, the light leakage reduction effect according to an exemplary embodiment will be described in greater detail with reference to FIGS. 5 to 8.

Figure 5:
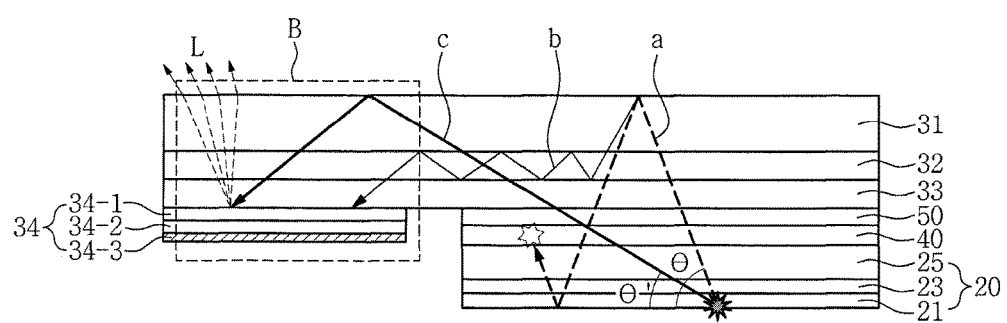
FIG. 5 is a cross-sectional view illustrating a path of reflected light in a display device without a light-path changing layer.
Figure 6:
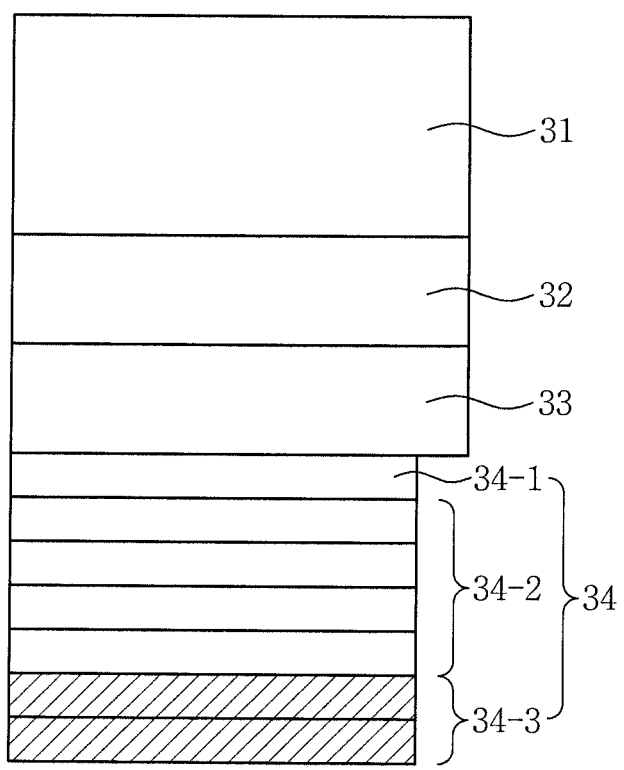
FIG. 6 is an enlarged view of the area "B" illustrated in FIG. 5.
Figure 7:
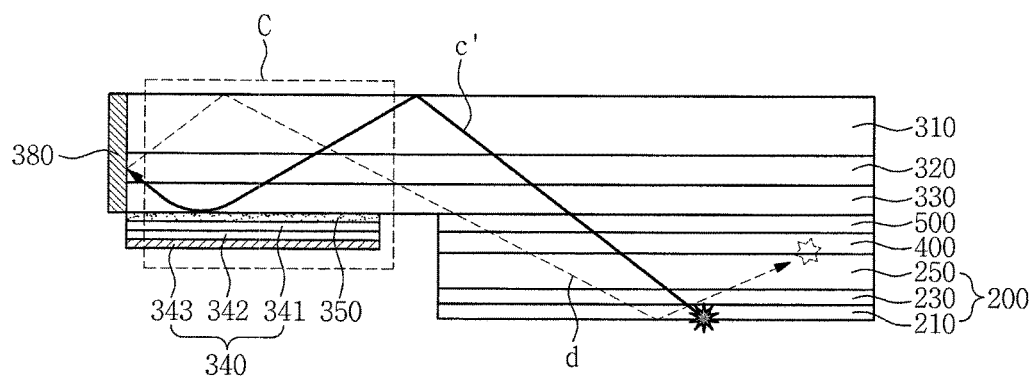
FIG. 7 is a cross-sectional view illustrating a path of reflected light in a display device according to an exemplary embodiment of the present invention.
Figure 8:
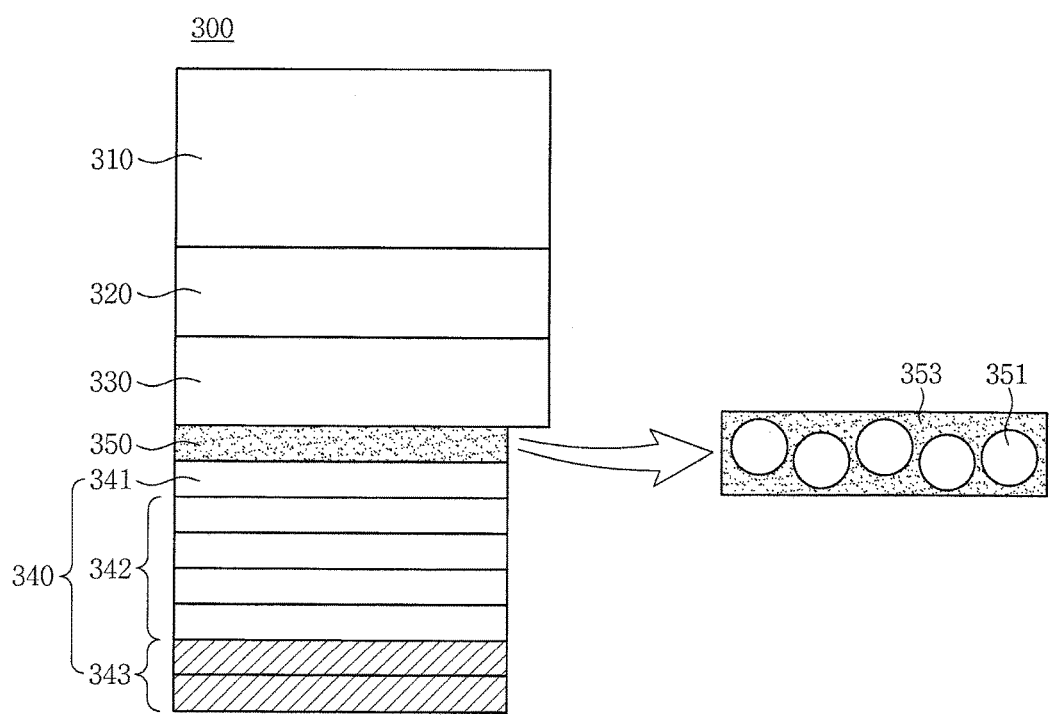
FIG. 8 is an enlarged view of the area "C" illustrated in FIG. 7.

FIG. 5 is a cross-sectional view illustrating a path of reflected (e.g., totally reflected) light in a display device without a light-path changing layer. FIG. 6 is an enlarged view of the area "B" illustrated in FIG. 5. FIG. 7 is a cross-sectional view illustrating a path of reflected (e.g., totally reflected) light in the display device according to an exemplary embodiment of the present invention. FIG. 8 is an enlarged view of the area "C" illustrated in FIG. 7.

The housing 610 and the impact-absorbing sheet 620 are omitted in FIGS. 5 and 7. FIG. 6 illustrates a printing layer 34 including a first decor printing layer 34-1 including a single layer, a second decor printing layer 34-2 including four layers having the same or substantially the same thickness, and a light-shielding printing layer 34-3 including two layers having the same or substantially the same thickness by way of example. FIG. 8 illustrates the printing layer 340 including the first decor printing layer 341 including a single layer, the second decor printing layer 342 including four layers having the same or substantially the same thickness, and the light-shielding printing layer 343 including two layers having the same or substantially the same thickness, by way of example. However, the structures of the printing layers 34 and 340 are not limited thereto, and the printing layers 34 and 340 may have a monolayer structure or a multilayer structure including a plurality of layers having different thicknesses.

A window 30 of the display device illustrated in FIGS. 5 and 6 includes a window base 31 and the printing layer 34 below the window base 31. In more detail, the window base 31, an OCA layer 32, a base film 33, and the printing layer 34 are sequentially arranged.

Referring to FIG. 5, light generated by an OLED 21 and reflected (e.g., totally reflected) at a surface of the window base 31 corresponding to an outermost optical interface may be divided into three lights. For example, the three lights may include a light a having a great incident angle $\theta$ and absorbed by a polarizer 40, a light b that is split at various layers based on Fresnel reflection to reach the printing layer 34, and a light c having a small incident angle $\theta'$, for example, in a range of about 5 degrees (°) to about 10°, and reaching the printing layer 34 subsequent to undergoing a reflection (e.g., a first total reflection) once.

Among the three lights a, b, and c, the light c causes light leakage that may be observed in the display device. The reflected (e.g., totally reflected) light c that is generated by the OLED 21, and that reaches a surface of the window base 31, is reflected by the window base 31 to reach the printing layer 34. The light c that has reached the printing layer 34 is dispersed and dissipated at the printing layer 34, and may be observed as light leakage L at the non-display area NDA of the window 30.

In comparison, the window 300 of the display device according to an exemplary embodiment illustrated in FIGS. 7 and 8 includes the window base 310, the OCA layer 320, the base film 330, the printing layer 340, the light-path changing layer 350 between the base film 330 and the printing layer 340, and the light-absorbing member 380 at a side surface of the window 300.

Thus, the display device according to an exemplary embodiment further includes the light-path changing layer 350 and the light-absorbing member 380, when compared to the display device illustrated in FIGS. 5 and 6.

The light-path changing layer 350 located between the window base 310 and the printing layer 340 may change a path of the light. The light-absorbing member 380 arranged at a side surface of the window 300 may absorb the light having the path changed by the light-path changing layer 350 to extinguish the light.

Referring to FIG. 8, the light-path changing layer 350 may include the optical structure 351 having a low refractive index, and the resin 353 having a high refractive index. A path of light between the optical structure 351 and the resin 353 having different refractive indices is changed based on Fresnel reflection. In other words, the light-path changing layer 350 changes the path of light to prevent or substantially prevent the reflected (e.g., totally reflected) light, which may cause light leakage, from reaching the printing layer 340.

Referring to FIG. 7, the light-path changing layer 350 changes a path of a reflected (e.g., a totally reflected) light c', which is generated by an OLED 210 and reflected from a surface of the window base 310, to prevent or substantially prevent the light c' from reaching the printing layer 340. The light c', which has the changed path, is absorbed by the light-absorbing member 380 and is extinguished. Accordingly, light leakage at the non-display area NDA of the window 300 is reduced or prevented.

Further, a light d that is not absorbed by the light-absorbing member 380 may again undergo reflection (e.g., total reflection) and may be absorbed by the polarizer 400. Accordingly, the light-absorbing member 380 may significantly reduce light leakage.

As described in the foregoing, the display device according to an exemplary embodiment of the present invention further includes the light-path changing layer 350 and the light-absorbing member 380, and thus, the reflected (e.g., totally reflected) light, which may cause light leakage, may not reach the printing layer 340. Accordingly, the display device according to an exemplary embodiment of the present invention may reduce or prevent light leakage.

Hereinafter, a pixel of the display panel 200 (refer to FIG. 1) will be described with reference to FIGS. 9 and 10.

Figure 9:
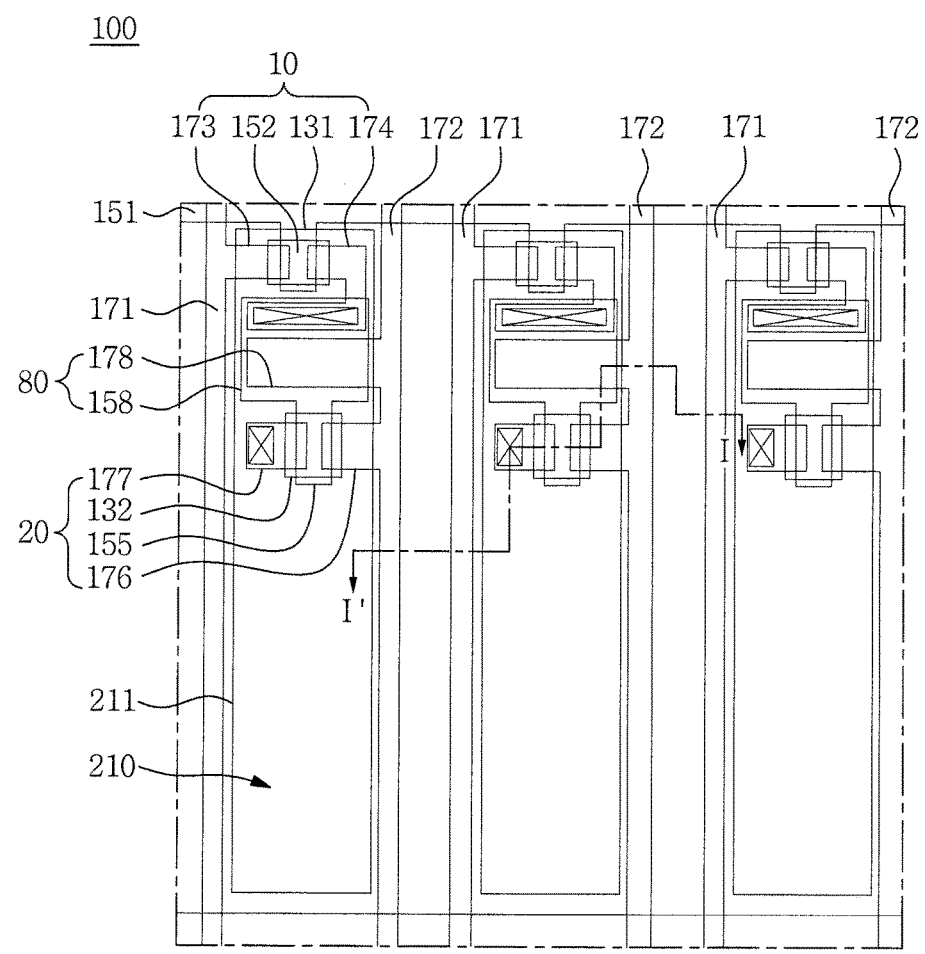
FIG. 9 is a plan view illustrating a pixel of a display panel at the area "A" of FIG. 1.

FIG. 9 is a schematic plan view illustrating a pixel of the display panel 200 at the area "A" of FIG. 1. FIG. 10 is a cross-sectional view taken along the line I-I' of FIG. 9.

Figure 10:
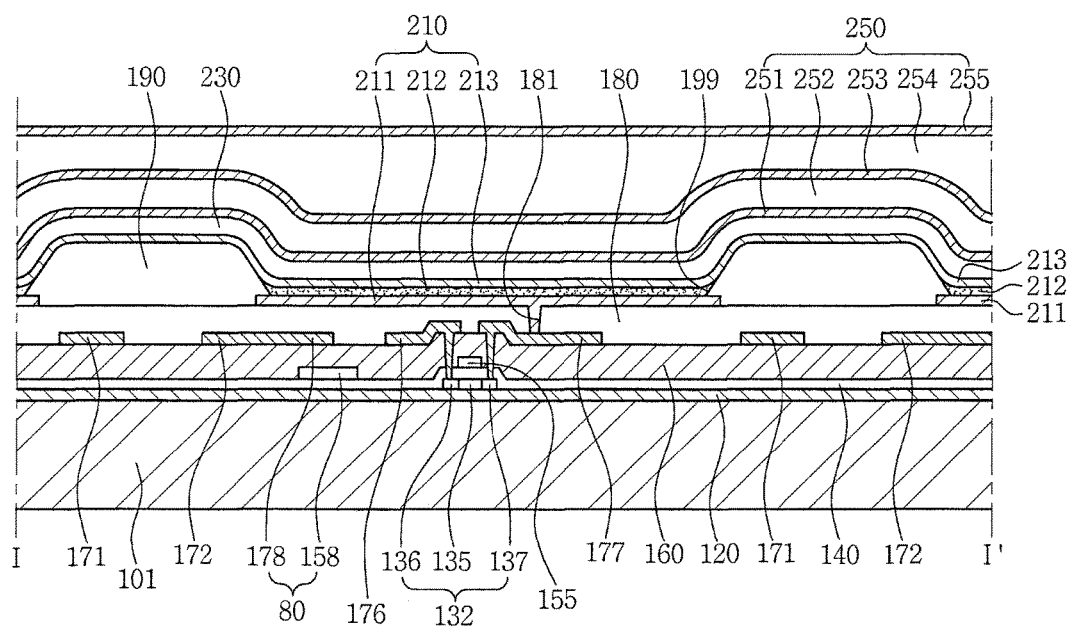
FIG. 10 is a cross-sectional view taken along the line I-I' of FIG. 9.

Referring to FIGS. 9 and 10, the OLED display device 100 according to an exemplary embodiment is illustrated as an AMOLED display device having a 2Tr-1 Cap (e.g., 2 transistors-1 capacitor) structure. Each pixel in the display area DA (refer to FIG. 1) includes two TFTs, for example, a switching TFT 10 and a driving TFT 20, and a capacitor, for example, a capacitor 80.

However, the present invention is not limited thereto, and in some embodiments, each pixel may include any suitable number of transistors and capacitors. Accordingly, the OLED display device 100 may have various structures, for example, a structure in which three or more TFTs and two or more capacitors are included in a pixel, and additional wirings may be further included. As used herein, the term "pixel" refers to a minimum unit for displaying an image, and the display area may display an image using a plurality of pixels.

The OLED display device 100 includes a first substrate 101. The switching TFT 10, the driving TFT 20, the capacitor 80, and the OLED 210 are respectively formed in the plurality of pixels on the first substrate 101. Gate lines 151 extending in a direction, and data lines 171 and common power lines 172 crossing and insulated from the gate line 151 are further formed on the first substrate 101.

The pixels may be located at crossing regions of the gate lines 151, the data lines 171, and the common power lines 172. However, the location of the pixels is not limited thereto.

The OLED 210 may include a first electrode 211, an organic light emitting layer 212 on the first electrode 211, and a second electrode 213 on the organic light emitting layer 212. The first electrode 211 may be a positive electrode (e.g., an anode electrode), for example, a hole injection electrode. The second electrode 213 may be a negative electrode (e.g., a cathode electrode), for example, an electron injection electrode. However, the types (kinds) of the first and second electrodes 211 and 213 are not limited thereto, and the first electrode 211 may be a cathode electrode and the second electrode 213 may be an anode electrode based on a driving scheme of the OLED display device 100.

Holes and electrons injected into the organic light emitting layer 212 are combined with each other to form excitons. The OLED 210 emits light by energy generated when the excitons fall from an excited state to a ground state.

The capacitor 80 includes a pair of storage electrodes. For example, the capacitor 80 may include first and second storage electrodes 158 and 178, with an insulating layer 160 therebetween. The insulating layer 160 may be a dielectric material. Capacitance of the capacitor 80 may be determined by an amount of electric charge stored in the capacitor 80, and the level of a voltage across the first and second storage electrodes 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 may be used as a switching element for selecting a pixel to emit light. The switching gate electrode 152 is connected to the gate line 151. The switching source electrode 173 is connected to the data line 171. The switching drain electrode 174 is spaced from the switching source electrode 173, and is connected to the first storage electrode 158.

The driving TFT 20 applies, to the first electrode 211, a driving power for emitting the organic light emitting layer 212 of the OLED 210 for the corresponding pixel selected by the switching TFT 10. The driving gate electrode 155 is connected to the first storage electrode 158 which is connected to the switching drain electrode 174. The driving source electrode 176 and the second storage electrode 178 are connected to the common power line 172. The driving drain electrode 177 is connected to the first electrode 211 of the OLED 210 through a drain contact hole 181.

The switching TFT 10 is operated by a gate voltage applied to the gate line 151 to transmit a data voltage applied to the data line 171 to the driving TFT 20.

A voltage having a level equal to or substantially equal to a difference between a level of a common voltage applied from the common power line 172 to the driving TFT 20 and a level of the data voltage transmitted from the switching TFT 10 is stored in the capacitor 80. A current having a level corresponding to the level of the voltage stored in the capacitor 80 flows to the OLED 210 through the driving TFT 20, to enable the OLED 210 to emit light.

Hereinafter, the configuration of the OLED display device 100 according to an exemplary embodiment of the present invention will be described in greater detail with reference to FIGS. 9 and 10.

In the present exemplary embodiment, the first substrate 101 may include an insulating substrate formed of glass, quartz, ceramic, plastic, or the like. However, the material used for forming the first substrate 101 is not limited thereto, and the first substrate 101 may include a metallic substrate formed of stainless steel, or the like.

A buffer layer 120 is on the first substrate 101. The buffer layer 120 prevents or substantially prevents the infiltration of impure elements into the first substrate 101, and planarizes a surface of the first substrate 101. However, the buffer layer 120 is not necessarily required, and thus, may be omitted based on the type (kind) of the first substrate 101, process conditions, and/or the like.

The driving semiconductor layer 132 is on the buffer layer 120. The driving semiconductor layer 132 may include a channel region 135 that is not doped with impurities, and a source region 136 and a drain region 137 formed at respective sides of the channel region 135 and doped with impurities (e.g., p-type impurities).

A gate insulating layer 140 is on the driving semiconductor layer 132. The driving gate electrode 155, the gate line 151 (refer to FIG. 9), and the first storage electrode 158 are formed on the gate insulating layer 140. The driving gate electrode 155 overlaps at least a portion of the driving semiconductor layer 132, for example, the channel region 135. The driving gate electrode 155 prevents or substantially prevents impurities from being doped in the channel region 135, when the impurities are doped in the source region 136 and the drain region 137 of the driving semiconductor layer 132 during the formation of the driving semiconductor layer 132.

The insulating layer 160 is on the gate insulating layer 140, and covers the driving gate electrode 155. The insulating layer 160 may include an insulating interlayer. The gate insulating layer 140 and the insulating layer 160 include contact holes through which the source region 136 and the drain region 137 of the driving semiconductor layer 132 are respectively exposed.

The driving source electrode 176, the driving drain electrode 177, the data line 171, the common power line 172, and the second storage electrode 178 are on the insulating layer 160 at the display area DA. The driving source electrode 176 and the driving drain electrode 177 are connected to the source region 136 and the drain region 137 of the driving semiconductor layer 132 through the contact holes, respectively.

A passivation layer 180 is formed on the insulating layer 160 to cover the driving source electrode 176, the driving drain electrode 177, and the like. The passivation layer 180 may include (or be formed of) an organic material, such as polyacrylate, polyimide, and/or the like. The passivation layer 180 may be a planarization layer.

The drain contact hole 181 is formed in the passivation layer 180, and the driving drain electrode 177 is exposed through the drain contact hole 181. The first electrode 211 is on the passivation layer 180, and is connected to the driving drain electrode 177 through the drain contact hole 181 of the passivation layer 180.

A pixel defining layer 190 is on the passivation layer 180 to cover a portion of the first electrode 211. An aperture 199 is formed in the pixel defining layer 190, and the first electrode 211 is exposed through the aperture 199. In other words, the first electrode 211 corresponds to the aperture 199 of the pixel defining layer 190.

The organic light emitting layer 212 is on the first electrode 211 within the aperture 199 of the pixel defining layer 190, and the second electrode 213 is on the pixel defining layer 190 and the organic light emitting layer 212.

One of the first electrode 211 and the second electrode 213 may include (or be formed of) a transparent conductive material, and the other thereof may include (or be formed of) a transflective conductive material or a reflective conductive material. The OLED display device 100 may be one of a top-emission-type display device, a bottom-emission-type display device, or a both-side (e.g., dual) emission-type display device, based on the type of materials used for forming the first and second electrodes 211 and 213.

The organic light emitting layer 212 may have a multi-layer structure including one or more of a light emitting layer, a hole injection layer ("HIL"), a hole transporting layer ("HTL"), an electron transporting layer ("ETL"), and/or an electron injection layer ("EIL").

A capping layer 230 may be further included on the second electrode 213. The capping layer 230 may protect the OLED 210, and may help the light generated from the organic light emitting layer 212 to be efficiently emitted externally.

The OLED display device 100 according to an exemplary embodiment of the present invention may further include a thin film encapsulation layer 250 on the capping layer 230.

The thin film encapsulation layer 250 may include one or more of inorganic layers 251, 253, and 255, and one or more of organic layers 252 and 254. The thin film encapsulation layer 250 may have a structure in which the inorganic layers 251, 253, and 255, and the organic layers 252 and 254 are alternately stacked. The inorganic layer 251 may be a lowermost layer. In other words, the inorganic layer 251 may be closest to the OLED 210 from among the inorganic layers 251, 253, and 255, and the organic layers 252 and 254. However, the present invention is not limited thereto, and in some embodiments, an organic layer may be the lowermost layer (e.g., may be closest to the OLED 210 from among the inorganic layers and the organic layers). Further, while the thin film encapsulation layer 250 in FIG. 10 is illustrated as including the three inorganic layers 251, 253, and 255, and the two organic layers 252 and 254, the present invention is not limited thereto.

The thin film encapsulation layer 250 may have a thickness that is less than or equal to about 10 micrometers (μm). Accordingly, the OLED display device 100 may have a relatively thin overall thickness.

In the case where the thin film encapsulation layer 250 is arranged on the OLED 210, an additional substrate may not be provided on the thin film encapsulation layer 250 (e.g., may be omitted). In this case, a flexible characteristic of the display panel 200 may be enhanced.

Figure 11:
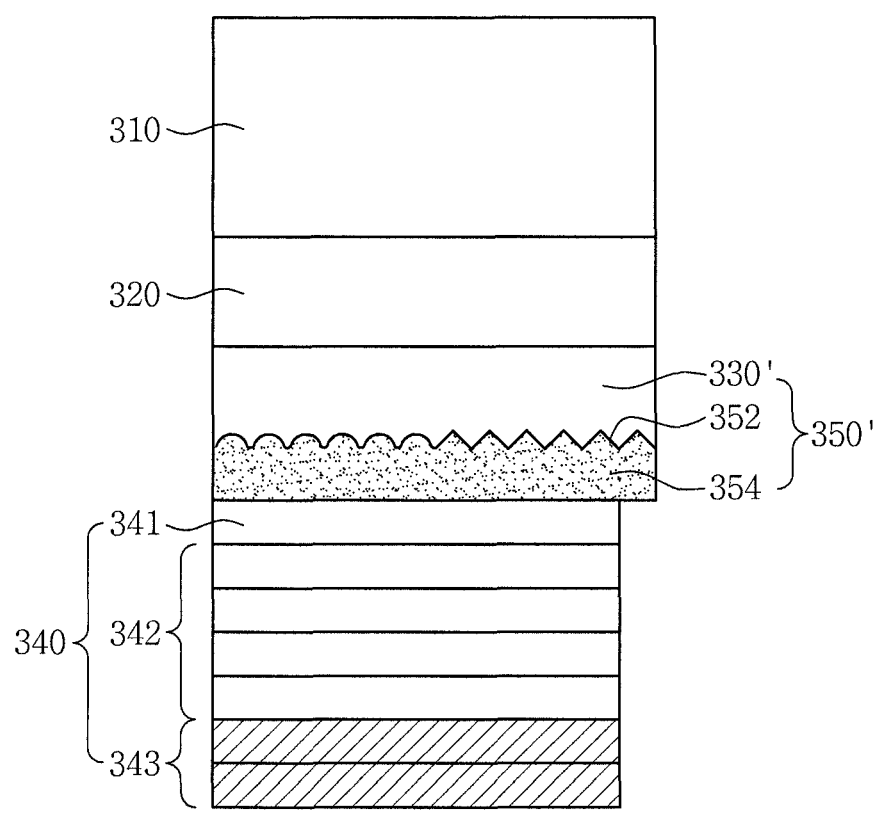
FIG. 11 is a cross-sectional view illustrating a display device according to another exemplary embodiment of the present invention.

FIG. 11 is a cross-sectional view illustrating a display device according to another exemplary embodiment of the present invention.

The display device according to another exemplary embodiment has the same or substantially the same configuration as that of the display device of FIG. 3, except for a structure of the light-path changing layer and a structure of the base film. Accordingly, a configuration of the display device according to the embodiment of FIG. 11 that is different from that of the display device of FIG. 3 will be described in more detail herein, and the same or substantially the same configuration therebetween is illustrated using the same reference numeral.

Referring to FIG. 11, a light-path changing layer 350' according to an exemplary embodiment of the present invention includes a base film 330', and a pattern layer 354 on a surface of the base film 330' and having a low refractive index.

A pattern 352 is formed on a lower surface of the base film 330', and a resin having a low refractive index is on (e.g., printed on) the pattern 352 to form the pattern layer 354 having a low refractive index. The base film 330' has a high refractive index, and the pattern 352 may be a three-dimensional ("3D") pattern having one of a lens shape and a prism shape.

As compared to the light-path changing layer 350 of the display device of FIG. 3, it may be appreciated that the pattern layer 354 having a low refractive index corresponds to the optical structure 351 (refer to FIG. 4), and the base film 330' having a high refractive index corresponds to the resin 353 (refer to FIG. 4) coating the optical structure 351.

In other words, the pattern layer 354 may have a refractive index that is less than that of the base film 330' by about 0.01 or more.

Accordingly, the light-path changing layer 350' according to an exemplary embodiment of the present invention may change a path of light based on Fresnel reflection due to a difference between refractive indices of the pattern layer 354 and the base film 330', to thereby reduce light leakage.

However, the present invention is not limited thereto, and in another exemplary embodiment, the pattern layer 354 may be on an upper surface of the base film 330. In this case, an OCA layer having a high refractive index may be on the pattern layer 354, and a path of light may be changed based on Fresnel reflection due to a difference between refractive indices of the pattern layer 354 and the OCA layer, to thereby reduce light leakage.

Figure 12:
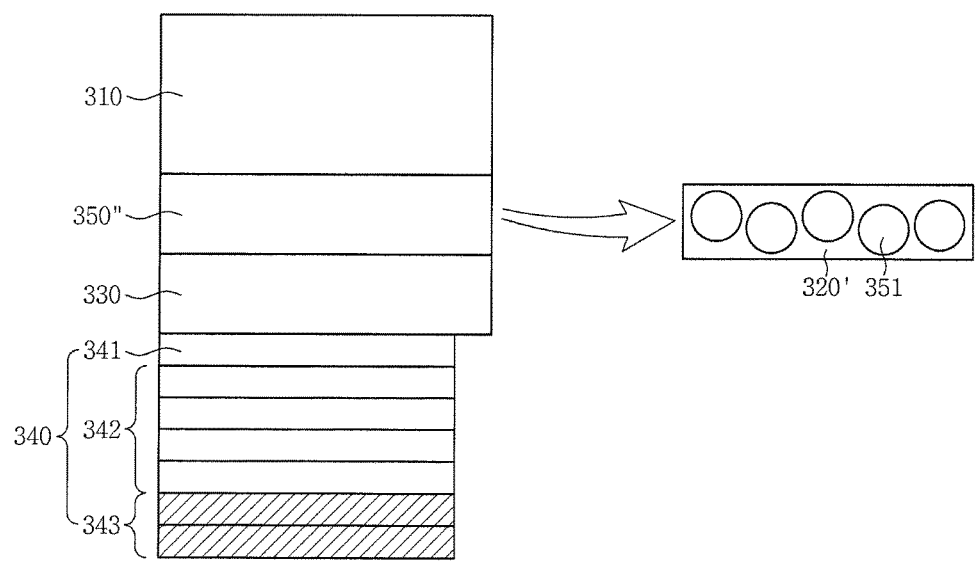
FIG. 12 is a schematic cross-sectional view illustrating a display device according to another exemplary embodiment of the present invention.

FIG. 12 is a schematic cross-sectional view illustrating a display device according to another exemplary embodiment of the present invention.

The display device according to the exemplary embodiment of FIG. 12 has the same or substantially the same configuration as that of the display device of FIG. 3, except for a structure of a light-path changing layer and a structure of a OCA layer. Accordingly, the same or substantially the same configuration therebetween is illustrated using the same reference numeral, and repeated description thereof will be omitted.

Referring to FIG. 12, a light-path changing layer 350" according to an exemplary embodiment of the present invention includes an optical structure 351 and an OCA layer 320' that coats the optical structure 351.

FIG. 12 illustrates the optical structure 351 as having a bead shape by way of example. However, in another exemplary embodiment, the optical structure 351 may have one of a lens shape, a prism shape, a trapezoid shape, and/or an elliptical shape. The OCA layer 320' has a high refractive index, and the optical structure 351 may have a refractive index that is less than that of the OCA layer 320' by about 0.01 or more.

The light-path changing layer 350" according to the exemplary embodiment of FIG. 12 may change a path of light between the optical structure 351 and the OCA layer 320 having different refractive indices based on Fresnel reflection. The light-path changing layer 350" may prevent or substantially prevent the light having the changed path from reaching the printing layer 340, to thereby reduce light leakage.

Hereinafter, the light leakage reduction effect of the display device according to an exemplary embodiment of the present invention will be described in greater detail with reference to FIGS. 13 and 14.

As illustrated in the foregoing with reference to FIG. 3, the light-path changing layer 350 of the display device according to an exemplary embodiment of the present invention includes the optical structure 351 having a low refractive index, and the resin 353 coating the optical structure 351 and having a high refractive index.

Figure 13:
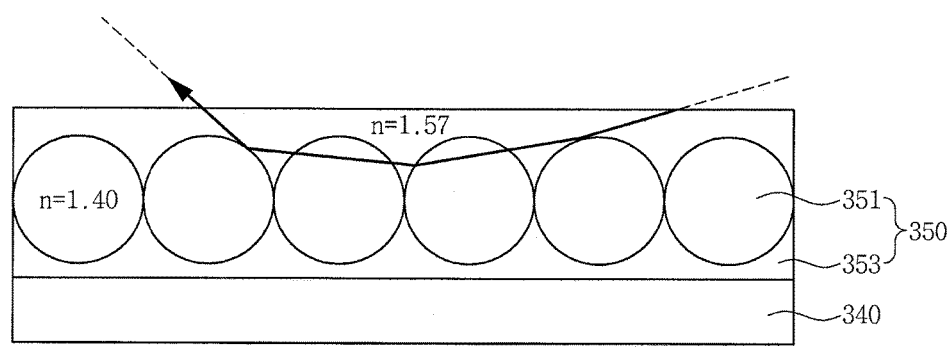
FIG. 13 is a view illustrating a simulation result of a light path of a display device according to an exemplary embodiment of the present invention.

FIG. 13 is a view illustrating a simulation result of a light path of the display device according to an exemplary embodiment of the present invention. The simulation is performed in the light-path changing layer 350 including a bead, for example, the optical structure 351, having a refractive index of 1.40 and a diameter of 2 μm, and the resin 353 having a refractive index of 1.57.

It may be verified from FIG. 13 that a path of light incident on the light-path changing layer 350 is changed due to a difference between refractive indices of the bead, that is, the optical structure 351, and the resin 353. Accordingly, it may be appreciated that the light-path changing layer 350 changes the path of the light to prevent or substantially prevent the light from reaching the printing layer 340, thereby reducing light leakage.

Figure 14:
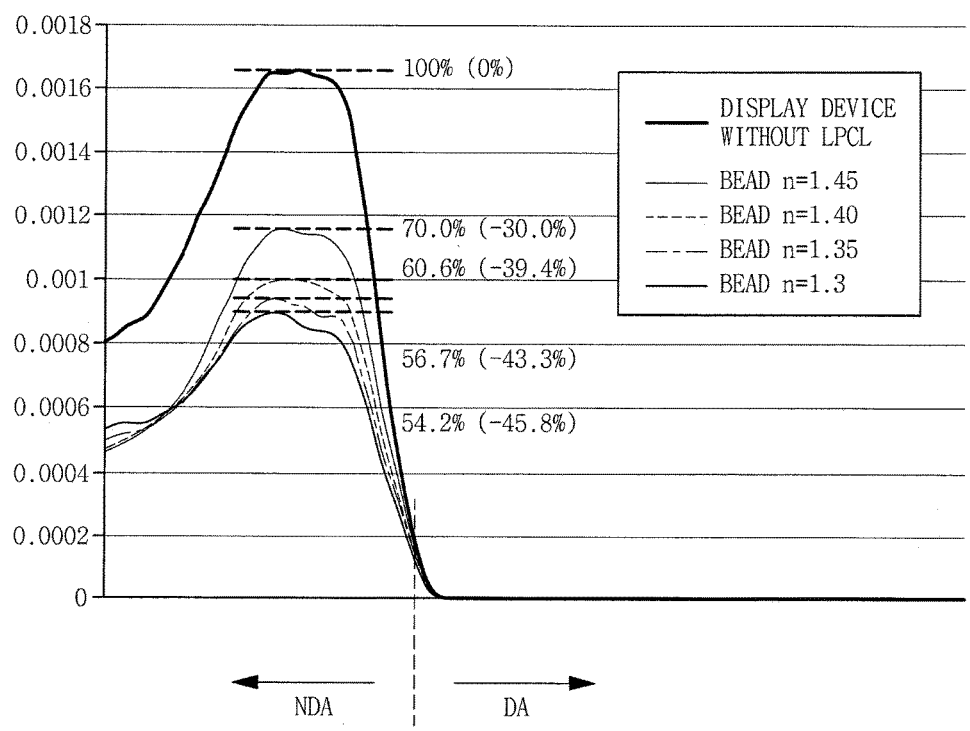
FIG. 14 illustrates graphs comparing amounts of light leakage being reduced based on a refractive index of an optical structure according to an exemplary embodiment of the present invention.

FIG. 14 illustrates graphs comparing amounts of light leakage being reduced based on a refractive index of the bead, that is, the optical structure 351 (refer to FIG. 13), of the display device according to an exemplary embodiment. The simulations are performed on a display device without the light-path changing layer (LPCL) and on display devices including the light-path changing layer 350 (refer to FIG. 13) that includes beads (e.g., the optical structure 351) having respective refractive indices of 1.45, 1.40, 1.35, and 1.30.

When a light leakage ratio of the display device without the LPCL is set to be about 100%, and the respective refractive indices of the beads included in the light-path changing layer 350 are 1.45, 1.40, 1.35, and 1.30, it may be verified from the graphs of FIG. 14 that the beads have respective light leakage ratios of 70.0%, 60.6%, 56.7%, and 54.2%. In other words, when the respective refractive indices of the beads are 1.45, 1.40, 1.35, and 1.30, the respective light leakage ratios of the beads are increased by 30.0%, 39.4%, 43.4% and 45.8%, as compared to the light leakage ratio of the display device without the LPCL.

In this regard, it may be verified based on the simulation results that the light leakage ratio (%) is reduced up to 45.8% in the display device according to an exemplary embodiment of the present invention as compared to that of the display device without the LPCL.

Hereinafter, a light leakage reduction effect of the display device according to another exemplary embodiment will be described in greater detail with reference to FIGS. 15 and 16.

As illustrated in the foregoing with reference to FIG. 11, the light-path changing layer 350' of the display device according to an exemplary embodiment of the present invention includes the pattern layer 354 on a surface of the base film 330' and having a low refractive index.

The base film 330' has a high refractive index, and the pattern 352 may be a 3D pattern having one of a lens shape and a prism shape.

Figure 15:
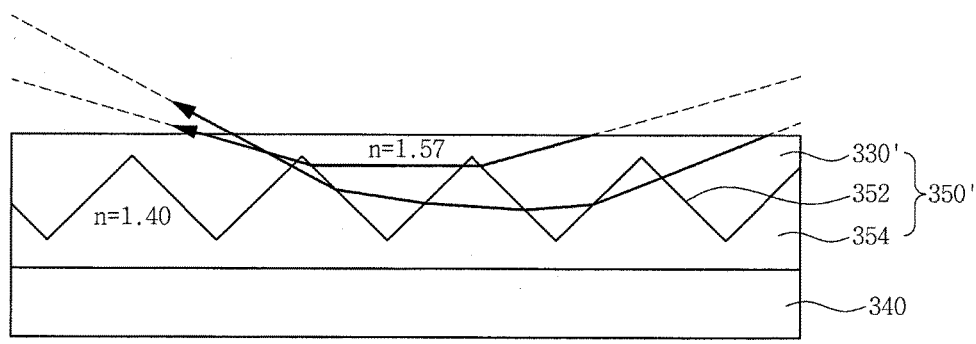
FIG. 15 is a view illustrating a simulation result of a light path of a display device according to another exemplary embodiment of the present invention.

FIG. 15 is a view illustrating a simulation result of a light path of the display device according to another exemplary embodiment of the present invention. The light-path changing layer 350' of the display device according to an exemplary embodiment includes the base film 330' having a refractive index of 1.57, and the pattern layer 354 having a refractive index of 1.40 and having the prism pattern 352 that has a width of about 4 μm and an apical angle of about 90° on a lower surface of the base film 330'.

It may be verified from FIG. 15 that a path of light incident on the light-path changing layer 350' is changed due to a difference between refractive indices of the pattern layer 354 and the base film 330'. Accordingly, it may be appreciated that the light-path changing layer 350' changes the path of light to prevent or substantially prevent the light from reaching the printing layer 340, thereby reducing light leakage.

Figure 16:
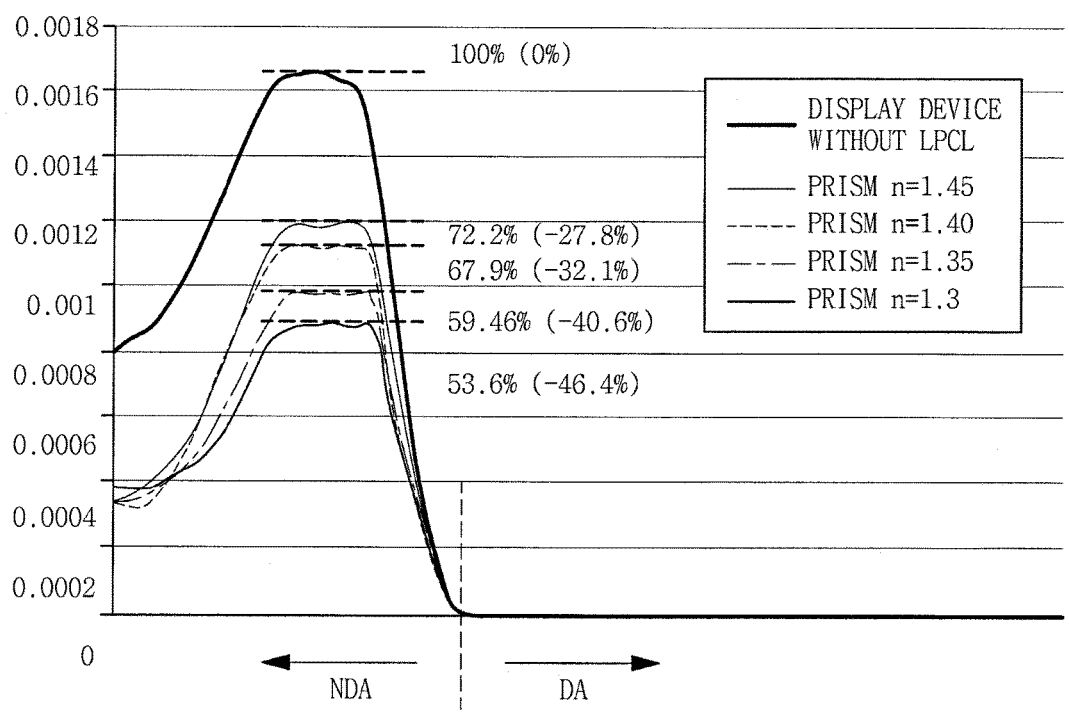
FIG. 16 illustrates graphs comparing amounts of light leakage being reduced based on a refractive index of an optical structure according to another exemplary embodiment of the present invention.

FIG. 16 illustrates graphs comparing amounts of light leakage being reduced based on a refractive index of the prism pattern 352 (refer to FIG. 11) of the display device according to another exemplary embodiment of the present invention. The simulations are performed on a display device without the light-path changing layer (LPCL), and on the display devices including the light-path changing layer 350' (refer to FIG. 11) that includes the prism patterns 352 (also referred to as "prisms" in FIG. 16) having respective refractive indices of 1.45, 1.40, 1.35, and 1.30.

When a light leakage ratio of the display device without the LPCL is set to be about 100%, and the respective refractive indices of the prisms included in the light-path changing layer 350' are 1.45, 1.40, 1.35, and 1.30, it may be verified from the graphs of FIG. 16 that the prisms have respective light leakage ratios of 72.2%, 67.9%, 59.46%, and 53.6%. In other words, when the respective refractive indices of the prisms are 1.45, 1.40, 1.35, and 1.30, the respective light leakage ratios of the prisms are increased by 27.8%, 32.1%, 40.6% and 46.4%, as compared to the light leakage ratio of the display device without the LPCL.

In this regard, it may be verified based on the simulation results that the light leakage ratio (%) is reduced up to 46.4% in the display device according to an exemplary embodiment of the present invention as compared to that of the display device without the LPCL.

As set forth above, according to one or more exemplary embodiments of the present invention, the light-path changing layer is provided at the window to reduce light that reaches the printing layer due to reflection (e.g., total reflection).

Accordingly, the display device according to one or more exemplary embodiments of the present invention may reduce light leakage.

From the foregoing, it will be appreciated that various embodiments of the present invention have been described herein for purposes of illustration, and that various modifications may be made without departing from the spirit and scope of the present invention. It will be appreciated that various features of the above described embodiments may be mixed and matched in any suitable manner, unless specifically described to the contrary, to produce further embodiments consistent with the spirit and scope of the present invention. Accordingly, the various embodiments disclosed herein are not intended to be limiting of the spirit and scope of the present invention, as defined by the following claims, and their equivalents.

What is claimed is:
1. A display device comprising:
   a display panel configured to display an image;
   a window covering the display panel and including a display area through which the image is to be transmitted, and a non-display area surrounding the display area, the window comprising:
      a window base opposite the display panel;
      a printing layer below the window base; and
      a light-path changing layer between the window base and the printing layer, the light-path changing layer comprising:
         an optical structure; and
         a resin coating the optical structure; and
   an adhesive layer between the display panel and the window.

2. The display device of claim 1, wherein the optical structure has a refractive index that is less than that of the resin by 0.01 or more.

3. The display device of claim 1, wherein the optical structure comprises at least one selected from $SiO_2$, polymethylmethacrylate ("PMMA"), tetrafluoroethylene ("TFE"), a fluorinated ethylene propylene copolymer ("FEP"), a hollow glass bead, and an aerogel.

4. The display device of claim 1, wherein the optical structure includes one of a bead shape, a lens shape, a prism shape, a trapezoid shape, and an elliptical shape.

5. The display device of claim 1, further comprising a base film between the window base and the printing layer.

6. The display device of claim 5, wherein the light-path changing layer is between the base film and the printing layer.

7. The display device of claim 1, wherein the light-path changing layer comprises a base film.

8. The display device of claim 7, wherein the optical structure corresponds to a pattern layer on the base film.

9. The display device of claim 7, further comprising a pattern layer corresponding to the optical structure on a surface of the base film, the pattern layer having a low refractive index, and the base film having a high refractive index.

10. The display device of claim 9, further comprising:
   another pattern layer on another surface of the base film, the another pattern layer having a low refractive index; and
   an optically clear adhesive ("OCA") layer on the another pattern layer, the OCA layer having a high refractive index.

11. The display device of claim 9, wherein the pattern layer has one of a lens shape and a prism shape.

12. The display device of claim 1, further comprising an optically clear adhesive ("OCA") layer between the window base and the printing layer.

13. The display device of claim 12, wherein the light-path changing layer comprises the OCA layer.

14. The display device of claim 13, wherein the optical structure is located in the OCA layer.

15. The display device of claim 1, further comprising a light-absorbing member at a side of the window.

16. The display device of claim 1, wherein the printing layer is at the non-display area and contacts the adhesive layer.

17. The display device of claim 1, wherein the printing layer comprises a first decor printing layer, a second decor printing layer, and a light-shielding printing layer.

18. The display device of claim 17, wherein the first decor printing layer comprises a pearlescent pigment and has a transparent color.

19. The display device of claim 17, wherein the second decor printing layer is a white printing layer.

20. The display device of claim 17, wherein the light-shielding printing layer is a black printing layer and contacts the adhesive layer.

* * * * *